United States Patent [19]

Kasama

[11] Patent Number: 5,665,519

[45] Date of Patent: Sep. 9, 1997

[54] RESIST MATERIAL

[75] Inventor: Kunihiko Kasama, Tokyo, Japan

[73] Assignee: NEC Corporation, Tokyo, Japan

[21] Appl. No.: 593,939

[22] Filed: Jan. 30, 1996

[30] Foreign Application Priority Data

Jan. 30, 1995 [JP] Japan ................................ 7-013140

[51] Int. Cl.[6] .......................... G03F 7/038; G03F 7/039
[52] U.S. Cl. ................................................ 430/270.1
[58] Field of Search ......................... 430/270.1, 285.1, 430/287.1, 20

[56] References Cited

U.S. PATENT DOCUMENTS

| | | | |
|---|---|---|---|
| 4,983,479 | 1/1991 | Broer et al. | 430/20 |
| 4,996,123 | 2/1991 | Nomura et al. | 430/20 |

FOREIGN PATENT DOCUMENTS

| | | |
|---|---|---|
| 3-66118 | 3/1991 | Japan . |
| 3-159114 | 7/1991 | Japan . |

OTHER PUBLICATIONS

J.W. Thackeray et al., "Deep UV ANR Photoresists For 248 nm Excimer Laser Photolithography", *SPIE vol. 1086 Advances in Resist Technology and Processing VI (1989)*, pp. 34–47.

C.G. Willson et al., "Approaches to the Design of . . . Improved Sensitivity and Resolution", *J. Electrochem. Soc.: Solid–State Science and Technology*, vol. 133, No. 1, Jan. 1986, pp. 181–187.

H. Ito et al., "Applications of Photoinitiators to the Design of Resists for Semiconductor Manufacturing", *Polymers in Electronics*, 1983, pp. 11–23.

R.A.M. Hikmet et al., *Polymer*, 1993, vol. 34, No. 8, pp. 1736–1740. No month given.

*Primary Examiner*—Cynthia Hamilton
*Attorney, Agent, or Firm*—Sughrue, Mion, Zinn, Macpeak & Seas

[57] ABSTRACT

A vertically orienting compound is added to a chemical amplification type resist to progress acid catalysis during baking after exposure and penetration of a developer in a developing step in the direction of depth of the resist. This improves the resist shape, the dimensional uniformity, and the resolving power in a lithography step.

7 Claims, 4 Drawing Sheets

RESIST MATERIAL

BACKGROUND OF THE INVENTION

1. Field of the Invention

The present invention relates to a resist material used in a lithography step of a semiconductor device fabrication process and, more particularly, to a chemical amplification type resist material improved in pattern resolution, vertical shape, and dimensional accuracy.

2. Description of the Prior Art

Recently, with increasing integration degree of LSIs, a demand for formation of high-accuracy fine patterns is becoming increasingly acute. Conventionally, the main current of this fine pattern formation technology (lithography) is an ultraviolet exposure technology which is a combination of an exposure apparatus (stepper) using the g-line or i-line of a mercury lamp and a novolak resist material (to be simply referred to as a resist hereinafter). In addition to improving the performance of a stepper (e.g., increasing the NA of a lens and improving the alignment accuracy), it has been attempted to increase the resolution of a novolak resist. However, if the exposure wavelength is shortened (e.g., deep ultraviolet light such as KrF excimer laser light or mercury arc lamp light near 250 nm is used) in order to further improve the resolving power, a rectangular resist shape cannot be obtained from a novolak resist because the light absorption of a resin and a naphthoquinonediazide photosensitive material is large. In addition, at the sensitivity (usually 100 to 200 mJ/cm$^2$) of a novolak resist the light intensity of a narrow-band KrF laser light source is lower than (⅕ to ¹/₁₀ as low as) those of the g- and i-lines. This undesirably prolongs the exposure time.

To overcome this situation, a chemical amplification type resist was proposed by H. Ito and C. G. Wilson in American Chemical Society Symposium Series, 242, p. 11 (1984). A resist of this type uses a catalytic reaction of an acid generated by a photosensitive acid generator, and so the required amount of an acid is small (on the order of $\mu_{mol}$/g). Accordingly, a high-sensitivity resist design is possible. Also, the resist shape can be greatly improved by selecting a low-concentration acid generator and a highly transparent resin.

FIG. 1 shows an example of acid catalysis of a positive chemical amplification type resist (a two-component system consisting of a main resin and an acid generator; in many instances various additives are mixed in the resist) made from a polytert-butoxycarbonyloxystyrene resin. FIG. 2 shows an example of acid catalysis of a negative chemical amplification type resist (a three-component system consisting of a main resin, an acid generator, and a crosslinking agent) consisting of PVP (polyvinylphenol resin) and a melamine crosslinking agent. These reactions are described in C. G. Wilson et al., Journal of Electrochemical Society, 133, p. 181 (1986) and J. W. Thackeray et al., Proceeding of SPIE (The Society of Photo-Optical Instrumentation Engineering), 1086, p. 34 (1989). As illustrated in FIG. 1, a positive resist consists of a resin, in which a polyvinylphenol soluble in a developer is protected by a tert-butoxycarbonyl group, and an acid generator, and becomes soluble in an alkaline developer when the protective group is removed by an acid. On the other hand, a negative resist, FIG. 2, consists of three components, a polyvinylphenyl resin, a melamine crosslinking agent, and an acid generator. An exposed portion of this negative resist becomes insoluble because a crosslinking reaction is encouraged by an acid. TABLE 1 shows a list of known representative acid generators.

TABLE 1

| NO. | NAME OF ACID GENERATOR | MOLECULAR FORMULA |
|---|---|---|
| 1 | BENZENEDIAZONIUM SALT (M IS As, Sb, OR P) | 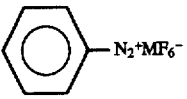 |
| 2 | DIPHENYLIODONIUM SALT (M IS As, Sb, OR P) | 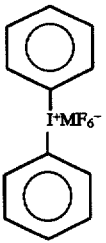 |
| 3 | TRIPHENYLSULFONIUM SALT (M IS As, Sb, OR P) | 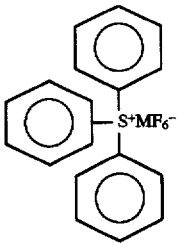 |

TABLE 1-continued

| NO. | NAME OF ACID GENERATOR | MOLECULAR FORMULA |
|---|---|---|
| 4 | 2,4-DITRI-CHLOROMETHYL-TRIAZINE DERIVATIVE (R IS ALKYL GROUP) | 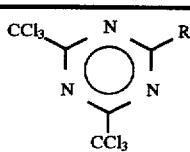 |
| 5 | 2,6-DINITRO-BENZYLTOSYLATE | 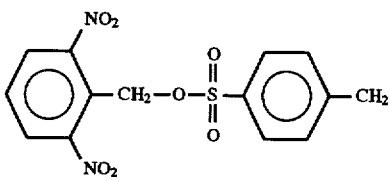 |
| 6 | p-NITROBENZYL-9,10-DIETHOXY-ANTHRACENE-2-SULFONATE | 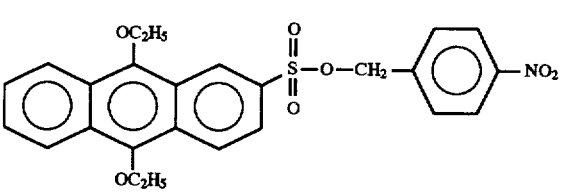 |

The conventional chemical amplification type resists described above greatly improve the sensitivity and the resolving power. As illustrated in FIG. 3A, however, a resin 12 of a positive resist film 10 which is applied on a silicon substrate 1A is randomly oriented and this gives rise to the following problems. In FIG. 3A, 11A as depicted by a white circle represents acid generator which did not optically react and 11B as depicted by a black circle represents acid generator which optically reacted.

(1) Chemical amplification type resists are different from novolak resists in that almost no optical fading occurs and absorption of exposure light is relatively large even after exposure. Accordingly, the exposure light intensity at the bottom of a resist is small, and so little acid is generated at the bottom of the resist film. As illustrated in FIG. 3B, therefore, resist patterns 10A and 10B are apt to become tapered. In particular, the taper angle θ, is 80° to 85° in positive resists to which a dye is added to reduce the influence of reflection from the underlying substrate to thereby increase absorption of light (the taper angle θ is 105° to 110° in negative resists). This problem is more serious on a substrate having a step as shown in FIG. 4A, since the thickness of a resist coating film varies.

(2) The solubility of a resist is determined by the acid diffusion and catalytic reaction during baking after exposure. The acid diffusion is isotropic, and a large diffusion length readily leads to a decrease in dimensional accuracy and resolution. Additionally, the amount of the generated acid changes in accordance with the density of patterns due to an optical proximity effect (the amount of the generated acid is large in a wide exposure region). Accordingly, as illustrated in FIG. 3B, the positive isolated line pattern 10B is thin; the negative isolated space pattern 10A is thick, and the interconnection to be formed is prone to short-circuiting.

(3) Alkali development also is isotropic; as the development proceeds in the direction of thickness the development proceeds in the horizontal direction on the surface portion of a resist. As a result, the resist pattern is tapered as illustrated in FIG. 3B, and the dimensional variation increases.

To solve the above problems, methods of vertically orienting the resin 12 in a resist have been proposed. That is, a method in which a magnetic field is applied to a wafer coated with a resist to thereby cause polarization orientation is proposed in Japanese Unexamined Patent Publication No. 3-66118, and a method in which an electric field is applied during baking after exposure is proposed in Japanese Unexamined Patent Publication No. 3-159114.

In the former method, however, exposure is performed while a uniform magnetic field is being applied. Accordingly, the exposure apparatus is enlarged in size, and it is also necessary to take account of the influence on electronic parts incorporated into the apparatus. Furthermore, the polarizability of a resin with a large molecular weight (the weight-average molecular weight is 10,000 to a few tens of thousands) used in a resist is small, and so it is in many cases difficult to sufficiently, vertically orient the resin even with application of a magnetic field. The developing machine also is complicated.

On the other hand, in the latter method of applying an electric field it is necessary to apply a uniform electric field during baking after exposure. This requires a special baking apparatus. Also, the concentration of the generated acid in the direction of thickness is controlled by the electric field. However, this concentration in the direction of thickness is sensitive to the field intensity, and consequently the resist dimensions are difficult to control. Furthermore, in an actual semiconductor device fabrication process the device structure varies from one microregion to another in a device (because conductive films and insulating films different in thickness form a multilayered structure). Accordingly, even if a constant electric field is externally applied, the concentration of an acid in the direction of thickness of a resist changes due to different electric fields in different microregions. This results in easy variations in pattern dimensions and shape.

SUMMARY OF THE INVENTION

It is an object of the present invention to provide a chemical amplification type resist material free from deterioration of the resist pattern shape and a decrease in resolution when used in the formation of fine patterns.

A resist material according to the first aspect of the present invention is a positive chemical amplification type resist material which contains at least a resin and a photosensitive acid generator and changes its solubility by using a catalytic reaction of an acid generated by the photosensitive acid generator, wherein a straight-chain compound having a vertically orienting nature is added.

A resist material according to the second aspect of the present invention is a negative chemical amplification type resist material which contains at least a resin and a photosensitive acid generator and changes its solubility by using a catalytic reaction of an acid generated by the photosensitive acid generator, wherein a straight-chain compound having a vertically orienting nature is added.

DETAILED DESCRIPTION OF THE PREFERRED EMBODIMENTS

Preferred embodiments of the present invention will be described below with reference to the accompanying drawings.

TABLES I and II show examples of straight-chain compounds used in the resist material of the present invention. The materials in TABLE I are organic molecules with a liquid crystal nature. The materials in TABLE II are made insoluble in an alkaline developer by adding hydroxyl groups to all or some of organic molecules and protecting the hydroxyl groups with, e.g., a tert-butoxycarbonyl group. When a substrate is treated with a surfactant such as lecithin [R'COOCH(CH$_2$COOR)(CH$_2$OPO$_2$O$^-$C$_2$H$_4$N$^{-30}$ $^{(CH}$$_3)_3$) wherein each of R' and R represents an alkyl group] before a substrate is coated with a resist, the resin in the resist is vertically oriented by straight-chain molecules having a vertically orienting nature. This is because when a surfactant is used, the substrate adsorbs this surfactant, and the resin in the resist orients along the orientation of the surfactant when substrate is coated with the resist material. When a surface treatment is performed using a surfactant, the adsorbed surfactant determines the orientation of a resist applied subsequently (if the resist contains a vertically orienting compound). As the vertically orienting surfactant, it is also possible to use FS150 (C$_3$F$_{17}$SO$_2$NH(CH$_2$)$_3$N$^+$(CH$_3$)$_3$I$^{31}$) or hexadecylamine (C$_{16}$H$_{33}$NH$_2$). The resist is exposed and baked, and during this baking acid catalysis takes place. Diffusion of the acid proceeds more easily in the vertical direction due to the action of the vertically oriented resin. Accordingly, the dimensional accuracy and the rectangularity of the resist pattern improve.

Figure 1:
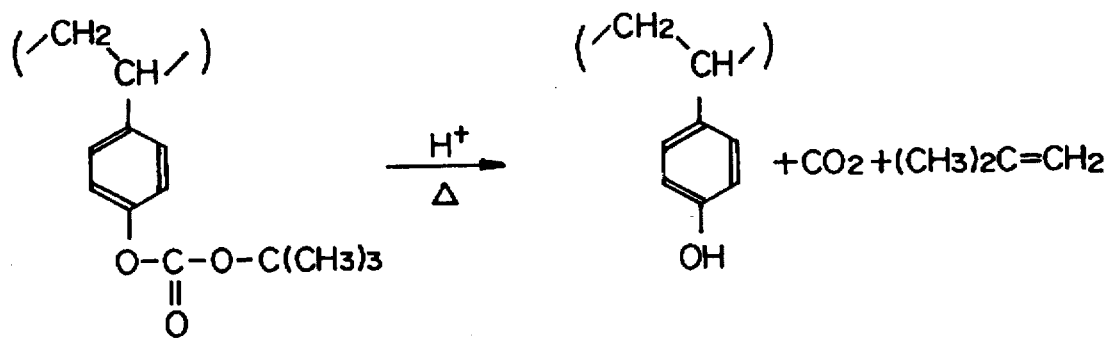
FIG. 1 is a chemical formula for explaining acid catalysis of a chemical amplification type positive resist.
Figure 2:
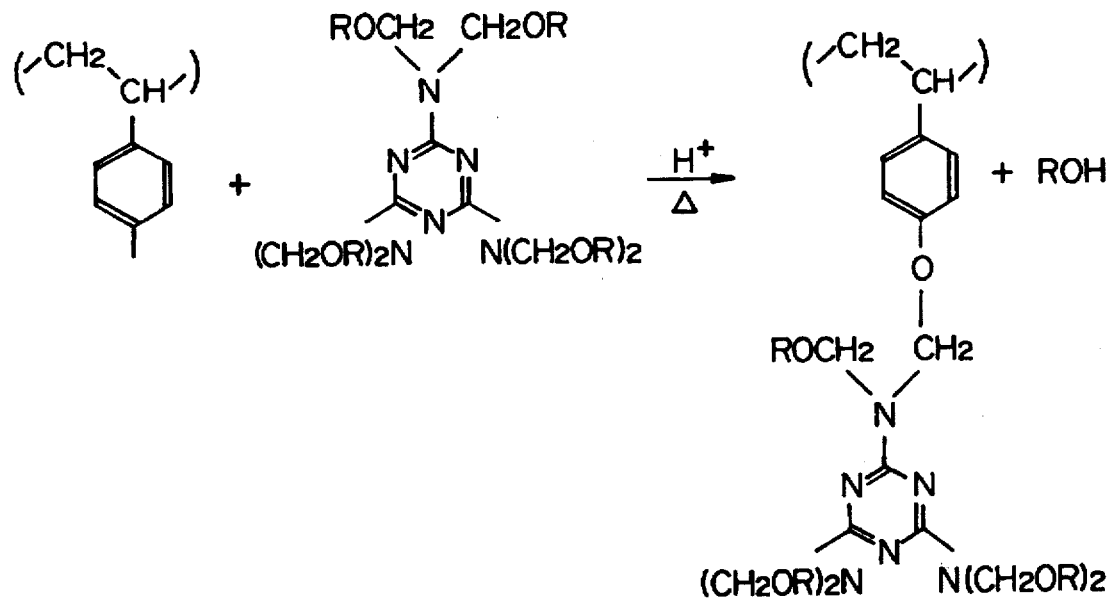
FIG. 2 is a chemical formula for explaining acid catalysis of a chemical amplification type negative resist.
Figure 3A:
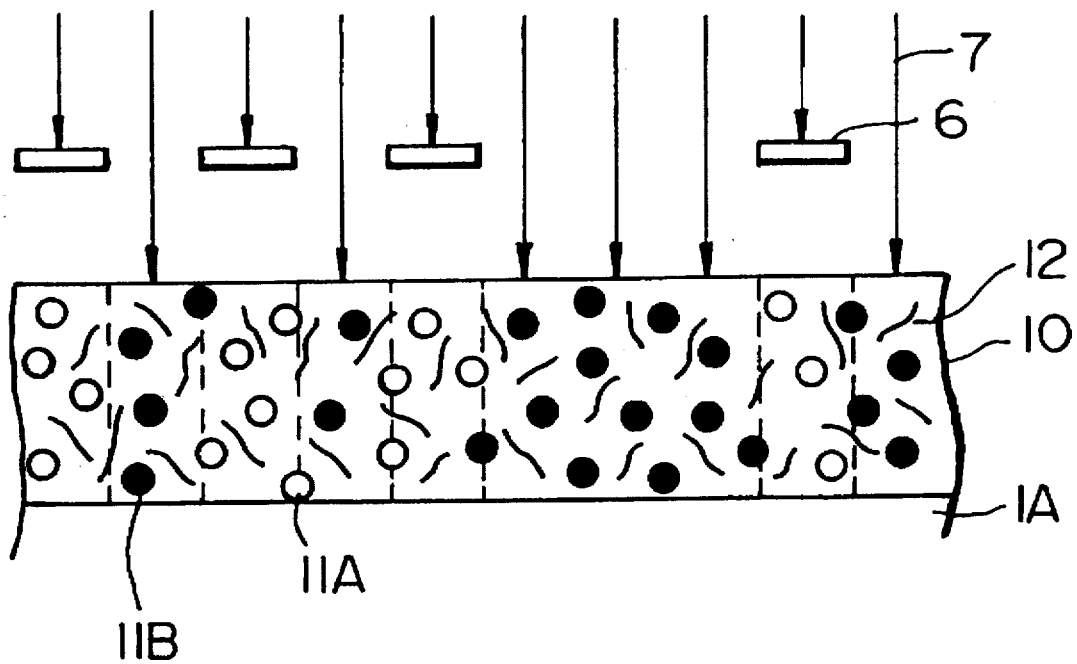
FIG. 3A is a view for explaining a resist pattern formation method when a conventional chemical amplification type positive resist is used.
Figure 3B:
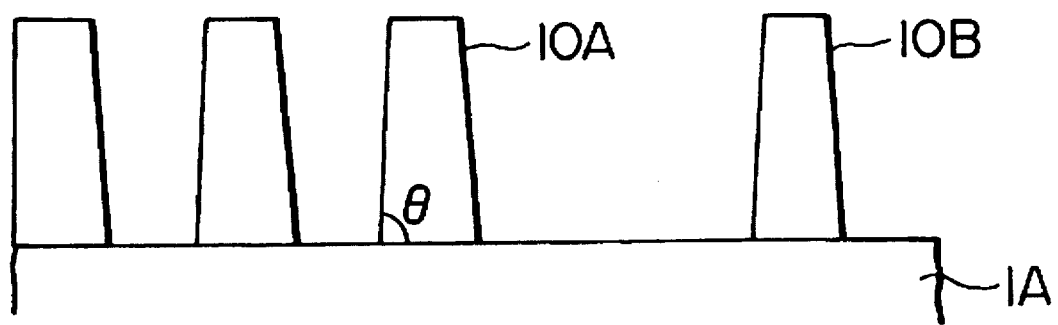
FIG. 3B is a view showing the shape of the resist patterns formed by the method in FIG. 3A.
Figure 4A:
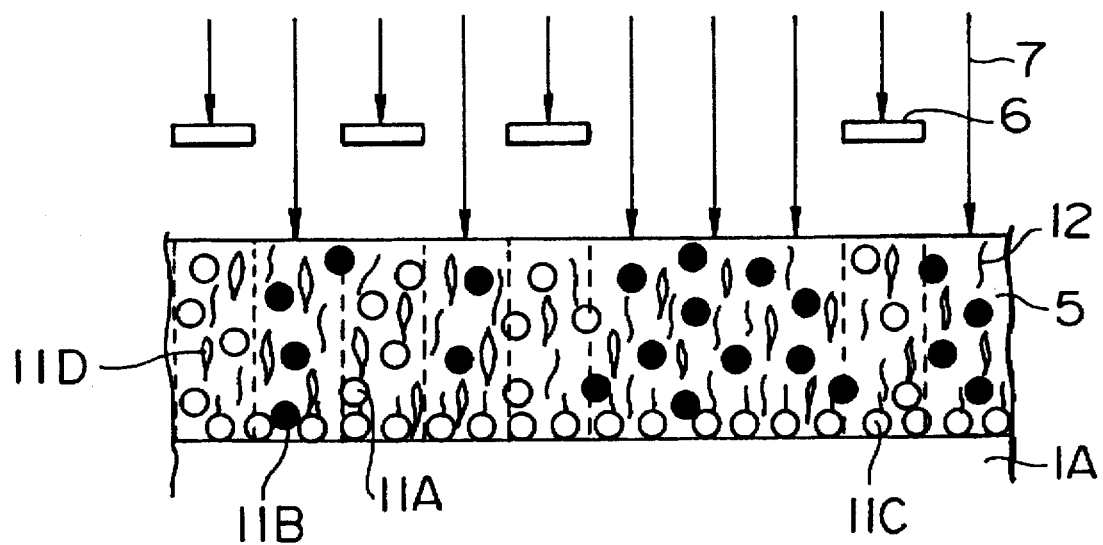
FIG. 4A is a view similar to FIG. 3A explaining a resist pattern formation method when chemical amplification type positive resist according to the present invention is used.

FIG. 4A shows orientation of ingredients inside a resist film in case of formation of resist patterns with a positive chemical amplification type resist containing a straight-chain molecule as a resist material according to the present invention. In FIG. 4A, the same ingredients are indicated by the same reference numerals used in FIG. 3A and 5 designates a positive chemical amplification type resist, 11C designates a vertically orientating agent and 11D designates a straight-chain molecule. As is clearly seen in FIG. 4A, the straight-chain molecule 11D and the resin 12 are substantially vertically orientated.

Furthermore, in a developing step the diffusion of an alkaline developer (usually TMAH, tetramethylammoniumhydride N$^+$(CH$_3$)$_4$OH$^-$) into the resist proceeds vertically, further improving the dimensional accuracy and the resist pattern rectangularity. As a result, the resolution and the depth of focus improve. Also, a hydroxyl group added with a protective group as shown in TABLE II is returned to a hydroxyl group by the acid and thereby the resist becomes easily soluble in a developer. This further increases the dissolution contrast.

Figure 4B:
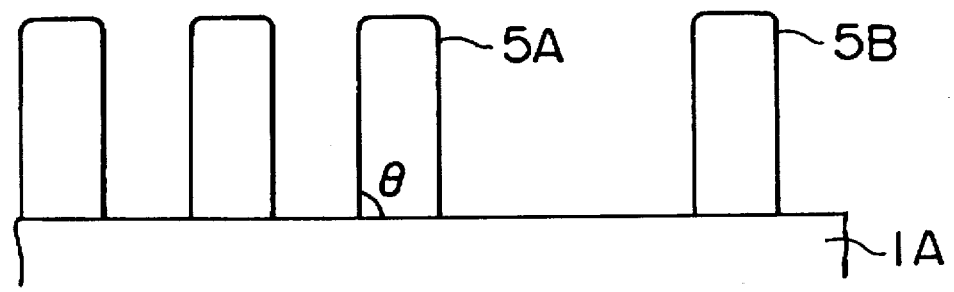
FIG. 4B is a view similar to FIG. 3B showing the shape of the resist patterns formed by the method in FIG. 4A.

FIG. 4B represents improvement in rectangularity of the resist pattern formed in the present invention. 5A and 5B designate resist patterns.

TABLES I and III (TABLE I is the same as for positive resists) show vertically orienting agents added to negative resists. A hydroxyl group is added to the orienting agents in TABLE III to make the agents easily soluble in an alkaline developer. In an exposed portion this hydroxyl group crosslinks to a melamine crosslinking agent to thereby make this portion insoluble.

TABLE I

| No. | Name of compound | Molecular formula |
|---|---|---|
| 1 | Cyclohexyl cyclohexane-carboxylate substituted compound | X—⬡—COO—⬡—Y |
| 2 | Aryl cyclohexane-carboxylate substituted compound | X—⬡—COO—⬡—Y |
| 3 | Aryl benzoate substituted compound | X—⌬—COO—⌬—Y |
| 4 | Biphenyl substituted compound | X—⌬—⌬—Y |
| 5 | Phenylpyrimidine substituted compound | X—⌬—(N⌬N)—Y |

TABLE I-continued

| No. | Name of compound | Molecular formula |
|---|---|---|
| 6 | Phenyldioxane substituted compound | X—⬡—⬡(O,O)—Y |

Each of X and Y represents an alkyl group, an alkoxy group, a cyano group, or a hydroxyl group.

TABLE II

| No. | Name of compound | Molecular formula |
|---|---|---|
| 1 | Cyclohexyl cyclohexane-carboxylate substituted compound | X—⬡—COO—⬡—Y, OZ |
| 2 | Aryl cyclohexane-carboxylate substituted compound | X—⬡—COO—⬡—Y, OZ |
| 3 | Aryl benzoate substituted compound | X—⬡—COO—⬡—Y, OZ |
| 4 | Biphenyl substituted compound | X—⬡—⬡—Y, OZ |
| 5 | Phenylpyrimidine substituted compound | X—⬡—⬡(N,N)—Y, OZ OZ |
| 6 | Phenyldioxane substituted compound | X—⬡—⬡(O,O)—Y, OZ |

Each of X and Y represents an alkyl group, an alkoxy group, a cyano group, or a hydroxyl group, and Z represents a tert-butoxycarbonyl group

—COC(CH₃)₃,
‖
O a tetrahydropyranyl group

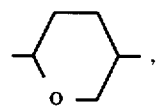

or a tert-butyl group—C(C₂H)₃.

TABLE III

| No. | Name of compound | Molecular formula |
|---|---|---|
| 1 | Cyclohexyl cyclohexane-carboxylate substituted compound | X—⬡—COO—⬡—Y, OH |
| 2 | Aryl cyclohexane-carboxylate substituted compound | X—⬡—COO—⬡—Y, OH |
| 3 | Aryl benzoate substituted compound | X—⬡—COO—⬡—Y, OH |
| 4 | Biphenyl substituted compound | X—⬡—⬡—Y, OH |
| 5 | Phenylpyrimidine substituted compound | X—⬡—⬡(N,N)—Y, OH OH |
| 6 | Phenyldioxane substituted compound | X—⬡—⬡(O,O)—Y, OH |

Each of X and Y represents an alkyl group, an alkoxy group, a cyano group, or a hydroxyl group.

A resist used in the first embodiment of the present invention is a positive resist and primarily consists of an acid generator in an amount of a few wt % with respect to a resin, PVP (polyvinylphenol resin) as a main resin in which a hydroxyl group is protected by a tert-butoxycarbonyl group, and a cyclohexanecarboxylic acid arylester substituted compound (10 to 30 wt %, preferably 10 to 20 wt % with respect to the resin; an example is a compound in which a tert-butoxycarbonyloxy group is added to an aromatic ring) as a straight-chain compound. If the ratio of the straight-chain compound to the resin is 10% or less, the orienting property decreases. If the ratio is 30% or more, the dissolution contrast and the heat resistance decrease.

Figure 5A:
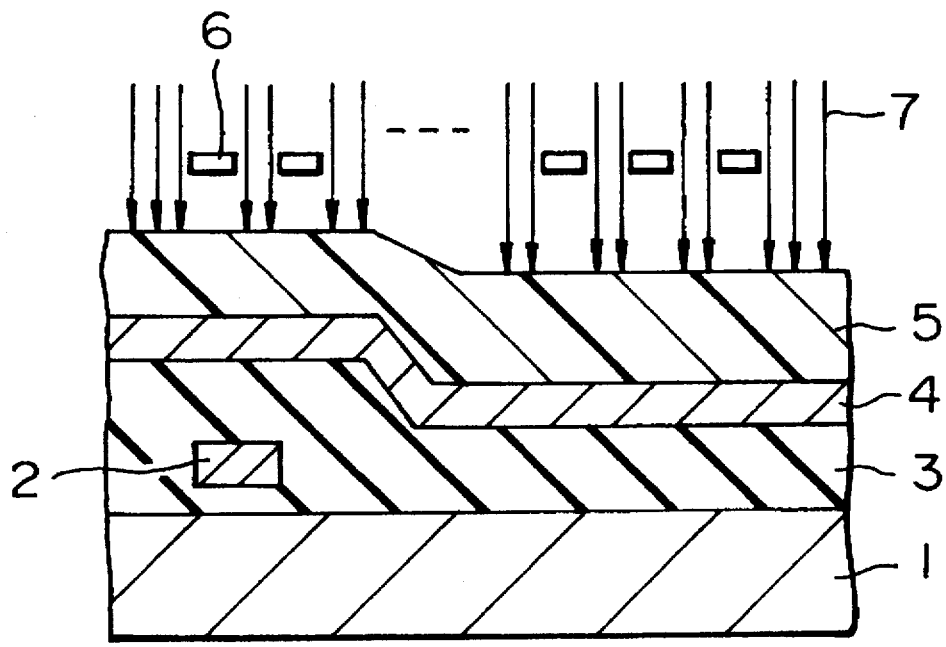
FIG. 5A is a sectional view showing a semiconductor chip fabricated by using a resist material according to the present invention.
Figure 5B:
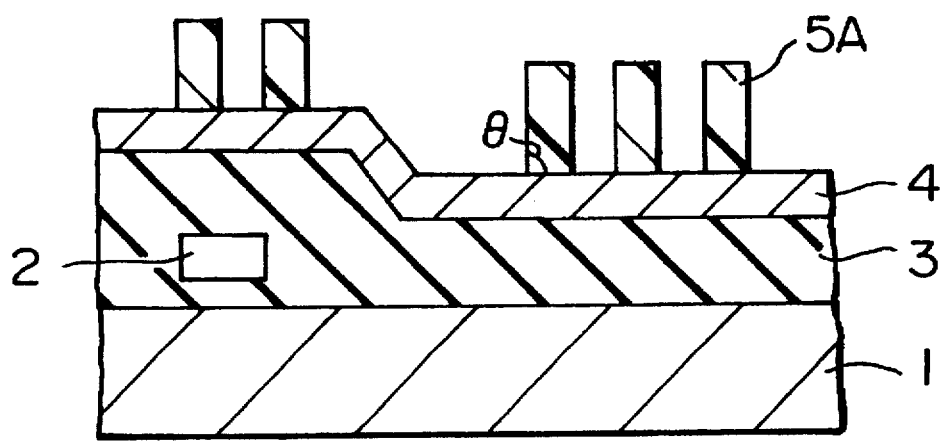
FIG. 5B is a sectional view showing the pattern shape of the semiconductor chip fabricated by the method in FIG. 5A.

FIGS. 5A and 5B are sectional views of a semiconductor chip for explaining a case where the resist of the present invention is applied to formation of metal interconnecting patterns 0.3 to 0.4 μm wide on a substrate having a step. The basic process is identical with a process using a common acid catalyst resist.

As shown in FIG. 5A, a first interconnection (or a gate electrode) 2 and an insulating interlayer 3 made from, e.g., boron phosphorus glass, are formed on a silicon substrate 1. A second interconnecting film 4 made from, e.g., Al, is formed on the insulating interlayer 3 by sputtering. The substrate is treated with a surfactant and coated with a positive chemical amplification type resist 5 of the present invention. In a portion near the step, the film thickness of the resist changes as shown in FIG. 4A. Thereafter, to form a second interconnecting pattern, the resist film 5 is irradiated with KrF excimer laser light 7 via a mask 6.

After exposure, baking is performed at 100° to 150° C. for 30 seconds to 3 minutes to allow an acid catalyst to cause an elimination reaction of a tert-butoxycarbonyl group only in opening portions of the mask. During the reaction, diffusion of the acid proceeds in the vertical direction but it does not occur in the horizontal direction due to a vertically oriented straight-chain molecule. In addition, since the tert-butoxycarbonyl group in the straight-chain molecule also is eliminated by the acid, the straight-chain molecule itself becomes easily soluble (the carboxylate in the main chain may also be hydrolyzed to further encourage the alkali solubility). Thereafter, when development is performed using an alkaline developer such as tetramethylammonium-hydride (TMAH), the developing process also occurs vertically. The result is a resist pattern 5A shown in FIG. 5B or resist patterns 5A and 5B shown in FIG. 4B having a high dimensional uniformity and a high rectangularity as shown in FIG. 5B. The taper angle θ, of this resist pattern 5A is about 90°, and the dimensional variation of the resist pattern also can be decreased to ±5% or less, which is conventionally ±8%.

By using this resist pattern 5A as a mask, the second interconnecting film 4 is anisotropically etched by a reactive gas plasma primarily consisting of a gas mixture of $Cl_2$ and $BCl_3$. A second interconnection is formed by removing the resist pattern 5A.

As the second embodiment of the present invention, a case where a second interconnection is formed on the substrate shown in FIG. 5B by using a negative resist will be described below. The resist used in this embodiment is a negative four-component resist consisting of an acid generator in an amount of a few wt % with respect to a resin, PVP (polyvinylphenol resin), a melamine crosslinking agent (added in an amount of 5 to 10 wt % with respect to the resin), and a vertically orienting straight-chain molecule added with a hydroxyl group, e.g., a cyclohexanecarboxylic acid arylester substituted compound (10 to 30 wt %, preferably 10 to 20 wt % with respect to the resin).

This resist is applied on a second interconnecting film 4 and irradiated with excimer laser light 7. After exposure, baking is done at 100° to 150° C. for 30 seconds to 3 minutes. Consequently, a crosslinking reaction is brought about by acid catalysis, and this makes the resist insoluble in an alkaline developer. As in the positive resist case, the vertically oriented straight-chain molecule progresses this acid catalysis in the direction of depth of the resist. Since the ingress of the developer proceeds in the vertical direction during a developing process, a rectangular resist pattern is obtained. The taper angle of this resist pattern is nearly 90°, similarly to that of the positive resist, and the dimensional variation also can be decreased to ±5% or less. Finally, by using this resist pattern as a mask, a second interconnection is formed by etching the second interconnecting film by using a reactive gas plasma primarily consisting of a chlorine-based gas.

In the present invention as has been described above, a straight-chain compound having a vertically orienting nature is added to a positive or negative chemical amplification type resist material. Accordingly, acid catalysis after exposure and developer ingress during development proceed in the direction of depth of the resist. Consequently, a rectangular resist pattern is obtained, and this improves the resolution of the resist. The resist material of the present invention can be applied to general lithography processes and hence is applicable to the fabrication of all semiconductor devices.

What we claimed is:

1. A positive chemical amplification type resist material which contains at least a resin and a photosensitive acid generator and changes solubility thereof by using a catalytic reaction of an acid generated by the photosensitive acid generator, wherein a straight-chain compound having a vertically orienting nature is added.

2. A resist material according to claim 1, wherein the straight-chain compound contains a substituent group which hydrolyzes and produces a hydroxyl group in the presence of an acid.

3. A resist material according to claim 1, wherein the straight-chain compound is one member selected from the group consisting of a cyclohexyl cyclohexanecarboxylate substituted compound, an aryl cyclohexanecarboxylate substituted compound, an aryl benzoate substituted compound, a biphenyl substituted compound, a phenylpyrimidine substituted compound, and a phenyldioxane substituted compound.

4. A resist material according to claim 1, wherein the resin in the resist is polarization-oriented without applying any magnetic field.

5. A negative chemical amplification type resist material which contains at least a resin and a photosensitive acid generator and changes solubility thereof by using a catalytic reaction of an acid generated by the photosensitive acid generator, wherein a straight-chain compound having a vertically orienting nature is added.

6. A resist material according to claim 5, wherein the straight-chain compound contains a hydroxyl group.

7. A resist material according to claim 5, wherein the straight-chain compound is one member selected from the group consisting of a cyclohexyl cyclohexanecarboxylate substituted compound, an aryl cyclohexanecarboxylate substituted compound, an aryl benzoate substituted compound, a biphenyl substituted compound, a phenylpyrimidine substituted compound, and a phenyldioxane substituted compound.

* * * * *

UNITED STATES PATENT AND TRADEMARK OFFICE
CERTIFICATE OF CORRECTION

PATENT NO. : 5,665,519
DATED : September 9, 1997
INVENTOR(S) : Kunihiko KASAMA

It is certified that error(s) appears in the above-identified patent and that said Letters Patent is hereby corrected as shown below:

Column 5, line 52, change "[R'COOCH(CH$_2$COOR)(CH$_2$OPO$_2$O$^-$C$_2$H$_4$N$^{-30\,(CH_3)_3}$)

to --[R'COOCH(CH$_2$COOR)(CH$_2$OPO$_2$O$^-$C$_2$H$_4$N$^-$ $^+$(CH$_3$)$_3$)--.

line 64, change "FS150(C$_3$F$_{17}$SO$_2$NH(CH$_2$)$_3$N$^+$(CH$_3$)$_3$I$^{31}$)"

to --"FS150(C$_3$F$_{17}$SO$_2$NH(CH$_2$)$_3$N$^+$(CH$_3$)$_3$I$^-$)--.

Signed and Sealed this

Nineteenth Day of May, 1998

Attest:

BRUCE LEHMAN

*Attesting Officer*     *Commissioner of Patents and Trademarks*